United States Patent
Benedict et al.

(10) Patent No.: US 11,732,378 B2
(45) Date of Patent: *Aug. 22, 2023

(54) THREE DIELECTRIC ELECTROHYDRODYNAMIC PATTERNING

(71) Applicant: PALO ALTO RESEARCH CENTER INCORPORATED, Palo Alto, CA (US)

(72) Inventors: Michael Benedict, Palo Alto, CA (US); David Mathew Johnson, San Francisco, CA (US); Elif Karatay, Mountain View, CA (US); Eric Weflen, Ames, IA (US); Ravi Neelakantan, Redwood City, CA (US)

(*) Notice: Subject to any disclaimer, the term of this patent is extended or adjusted under 35 U.S.C. 154(b) by 332 days.

This patent is subject to a terminal disclaimer.

(21) Appl. No.: 16/590,902

(22) Filed: Oct. 2, 2019

(65) Prior Publication Data
US 2021/0102305 A1    Apr. 8, 2021

(51) Int. Cl.
*C25D 13/04* (2006.01)

(52) U.S. Cl.
CPC ................... *C25D 13/04* (2013.01)

(58) Field of Classification Search
CPC ......... B29C 59/10; B29C 59/12; B29C 41/28; B29C 41/38; B29C 2043/025; B29C 2043/3211; B29C 43/003; C25D 13/04; G03F 7/0002; G03F 7/161; G03F 7/2012; G03F 7/70; B82Y 40/00; B82Y 10/00; H01L 35/30; H01L 35/32; H01L 35/34; H01L 21/31058; B05C 9/12; B05C 5/005; B05C 9/08; B05C 5/007; G03G 13/10; G03G 15/02; B41F 16/00; B05D 3/067; B05D 3/145; B05D 1/40; B81C 1/0046; H05K 3/0011; Y10T 428/24521

See application file for complete search history.

(56) References Cited

U.S. PATENT DOCUMENTS

| | | | |
|---|---|---|---|
| 2,476,282 A | 7/1949 | Castellan | |
| 4,166,089 A | 8/1979 | DeGeest et al. | |
| 6,391,217 B2* | 5/2002 | Schaffer | B82Y 40/00 216/41 |
| 6,908,861 B2* | 6/2005 | Sreenivasan | B81C 1/0046 257/E21.024 |

(Continued)

OTHER PUBLICATIONS

Reddy et al. (J. Phys. Chem. C 2012, 116, 22847-22858), "Electric-Field-Induced Instabilities in Thin Liquid Trilayers Confined between Patterned Electrodes" (Year: 2012).*

(Continued)

*Primary Examiner* — Xiuyu Tai
(74) *Attorney, Agent, or Firm* — Miller Nash LLP

(57) ABSTRACT

A system to electrohydrodynamically pattern a material includes a first electrode having a first voltage, a second electrode having a second voltage that is different from the first voltage, one or more materials to be patterned residing between the first electrode and the second electrode, a gap between at least one surface of at least one of the materials to be patterned and one of the first or second electrodes, at least one patterning material in the gap, wherein the patterning material is a material other than air, and at least one filling material filling any remainder of the gap.

12 Claims, 9 Drawing Sheets

(56) References Cited

U.S. PATENT DOCUMENTS

| | | | | |
|---|---|---|---|---|
| 6,964,793 B2* | 11/2005 | Willson | ................ | B05D 3/067 |
| | | | | 427/256 |
| 7,163,611 B2 | 1/2007 | Volkel | | |
| 7,887,739 B2* | 2/2011 | Chou | ................ | B29C 59/022 |
| | | | | 264/479 |
| 8,562,795 B2* | 10/2013 | Chen | ................ | G03G 13/286 |
| | | | | 204/224 M |
| 9,348,231 B2* | 5/2016 | Johnson | ................ | B05C 5/007 |
| 2002/0005391 A1 | 1/2002 | Schaffer et al. | | |
| 2005/0022790 A1 | 2/2005 | Nickel et al. | | |
| 2009/0258188 A1 | 10/2009 | Cha et al. | | |
| 2015/0021161 A1 | 1/2015 | Johnson et al. | | |
| 2018/0178167 A1 | 6/2018 | De Lannoy et al. | | |

OTHER PUBLICATIONS

Goldberg-Openheimer et al. (Adv.Mater.2012, 24, OP175-OP180), "Hierarchical Electrohydrodynamic Structures for Surface-Enhanced Raman Scattering" (Year: 2012).*

* cited by examiner

THREE DIELECTRIC ELECTROHYDRODYNAMIC PATTERNING

TECHNICAL FIELD

This disclosure relates to electrohydrodynamic patterning, more particularly to electrohydrodynamic patterning of materials.

BACKGROUND

Patterning polymer materials, typically films, may take many forms. One can use molds or stamps to press into the polymer film and then cure the film to hold the shapes, referred to here as features, in place. Features may comprise patterns or other shapes pressed into the film, or extensions that extend above the surface of the film. However, molds can wear out, making the features formed by the molds less precise. When working with very fine features, removing the mold or stamp can result in damage to the feature.

Electrohydrodynamic patterning of films provides one solution for producing films with fine features. In electrohydrodynamic film patterning (EHD-FP), controlled application of an electric field causes the film to 'move' to form a desired feature, such as a pattern, in the film. Once the pattern forms, the system fixes it into place, such as by cooling the film to harden it, curing the film using heat or ultraviolet light, etc. An advantage of EHD-FP lies in the lack of contact, as occurs when using molds or stamps. This allows for formation of features that may otherwise be affected by the removal of the stamp or mold.

A limitation of EHD-FP patterning lies in the difficulty in embossing features into the surface of the film, creating multilevel features, and achieving sharp features.

SUMMARY

According to aspects illustrated here there is provided a system to electrohydrodynamically pattern a material that includes a first electrode having a first voltage, a second electrode having a second voltage that is different from the first voltage, one or more materials to be patterned residing between the first electrode and the second electrode, a gap between at least one surface of at least one of the materials to be patterned and one of the first or second electrodes, at least one patterning material in the gap, wherein the patterning material is a material other than air, and at least one filling material filling any remainder of the gap.

According to aspects illustrated here there is provided a system to electrohydrodynamically pattern a film that includes a first electrode having a first voltage, a second electrode, at least one dielectric material to be patterned residing between the first electrode and the second electrode, the first dielectric material being responsive to an electric field formed between the first electrode and the second electrode, a gap between a surface of the first dielectric material and at least one of the first and second electrodes, at least one patterning material selectively located on the at least one dielectric material to be patterned, such that the at least one patterning material fills only a portion of the gap, and a filling material in the gap.

According to aspects illustrated here there is provided a method of electrohydrodynamically patterning a film, that includes placing at least one material to be patterned on a surface positioned to be inserted into a gap between a first electrode having a first voltage and a second electrode having a second voltage different from the first voltage, depositing at least one patterning material on the at least one material to be patterned such that the at least one patterning material does not fill the gap and the at least one patterning material is a material other than air, and applying an electric field to the gap between the first and second electrodes to cause the at least one material to be patterned to form a pre-determined pattern.

DETAILED DESCRIPTION OF THE EMBODIMENTS

Figure 1:
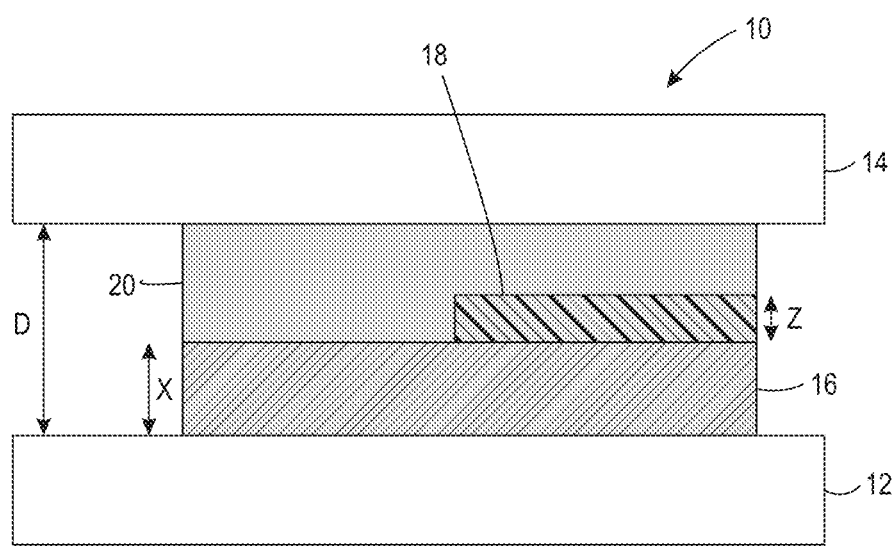
FIGS. 1-4 show embodiments of a system to electrohydrodynamically pattern materials using at least one patterning material.

Electrohydrodynamic film patterning (EHD-FP) involves applying an electric field to a polymer or other film in order to shape the surface of the film. The shaping is typically accomplished by application of an electric field that causes the material forming the film to respond. The patterns caused in the film depend upon, to name a few factors, the viscosity and responsiveness of the material to the electric field, the film surface tension, and the strength of the electric field which is a function of the applied voltage, and the distance between the electrodes.

An advantage of EHD-FP lies in the lack of contact between the film being patterned and the patterning apparatus. In contact patterning applications, such as stamps or molds, the removal of the stamp or mold can cause damage or alter the resulting structure. With EHD-FP, finer features may be formed as there is no contact that could cause those features to be damaged.

The embodiments here employ three or more electrically responsive materials. These materials may have different dielectric constants or different electrical conductivities. The dielectric constant, also referred to as the relative permittivity, is related to a material's electrical susceptibility, which may include how responsive a material is to an applied electric field. In a typical EHD-FP system two dielectric materials are used. Typically one material is air or another gas and the second material is a dielectric fluid "material to be patterned." As an electric field is applied to the two dielectric materials, differences in the field strength either naturally occurring, or due to field shaping, cause a net movement in the two dielectric materials. The material to be patterned can then be solidified in order to permanently retain the resulting pattern.

In the present embodiments using a third material as a "patterning" material can alter the response of the other two materials to the field. The patterning material may have a different dielectric constant, or, in the case of electrically conductive materials, different conductivity, or simply modify the electric field strength by altering the gap between the electrode and the material to be patterned. Multiple materials to be patterned, and multiple patterning materials, can be used to create more complex patterns. The embodiments here allow for continuous processing, which results in commercially useful quantities of EHD films that may have more complex patterns with finer features than would be formed using a single material and the electric field.

One should note that some of the embodiments below use only one material to be patterned, but only for ease of discussion and understanding. As mentioned above more than one material may undergo patterning, so while the discussion focuses on a single material to be patterned, the application of the embodiments are to at least one material to be patterned. Similarly, some of the embodiments below use one patterning material and some use two. Again, no limitation is intended by this and none should be implied. In addition, the discussion here does not consider air or other gases as patterning materials, but may be referred to as "filling" materials as they fill the gap between the electrodes and/or the materials.

FIG. 1 shows one embodiment of an EHD system using at least three materials: a material to be patterned, a patterning material, and air or other gas in the gap. There may be more than one material to be patterned and more than one patterning material. The system 10 has two electrodes 12 and 14 that are separated by a gap of distance D. The electrodes, when activated will each have a voltage where the two voltages are different. In the gap between the two electrodes resides the material to be patterned 16. Although the material to be patterned is shown as residing on the surface of the electrode 12, it may reside on the surface of either electrode or on an intermediate surface between them, as is discussed in further figures. The first material to be patterned has a thickness or height of x, and the patterning material has a thickness of z.

The patterning material 16 resides on the first material. The patterning material 16 may also be patterned or just deposited on a selected region of the first material. The patterning material 16 can also be deposited onto either electrode. If the patterning material 16 itself is patterned, it will typically be patterned based upon a desired pattern to be formed in the material to be patterned 16. The patterning material 16 has a thickness of z. In some embodiments, selectively patterning the full height of the gap D may occur in a 3 dielectric system and can produce different effects.

In one embodiment, the remaining space 20 in the gap between the electrodes may be filled with another dielectric material. This material is typically a gas, but can also be a fluid or semi-solid material, each with their own dielectric constants. To avoid confusion with other systems in which air could be considered a patterning material, the embodiments here have a patterning material that is something other than air. The electric field is altered by the differences in dielectric constant or conductivity of the patterning materials, the materials to be patterned, and air or other gas At least one of the materials must have electrical properties differing from the other two.

In addition, activation of the electrodes causes an electric field to be applied to all of the dielectric materials between the two electrodes. Typically, the electrodes will not apply the electric field until the stack of films is in the active region, which is defined as the region between the two electrodes. It is conceivable that the patterning material could be applied to the material to be patterned in the active region, but that the electrodes do not become active until the application of the patterning material. As will be discussed below, it is more likely that the stack of materials will be transported into the active region in which the electrodes are always 'on.'

When the material to be patterned along with the patterning material enters the presence of the electric field, the differential conductivity of dielectric constant of the material causes a difference in the electric field experienced by the material to be patterned. In this sense, the patterning material functions much like a patterned electrode would in more traditional EHD-FP setups to create a pressure differential on the surface of the film. This pressure differential in the film surface in turn causes the material to be patterned to change shape and reflect the shape of the patterning material. The choice of patterning material and the electrical properties of the patterning material relative to a third material and the material to be patterned will dictate the magnitude and direction of the pressure differential and cause the film to have features of different heights based on the differences in electric field.

At least one of the electrodes 12 and 14 may also have a pattern to generate a shaped or non-continuous electric field. This can be achieved by a voltage profile on at least one of the electrodes that is non-uniform in space, or by altering the geometry of the electrode to create a non-uniform gap D as shown in FIG. 2.

Figure 2:
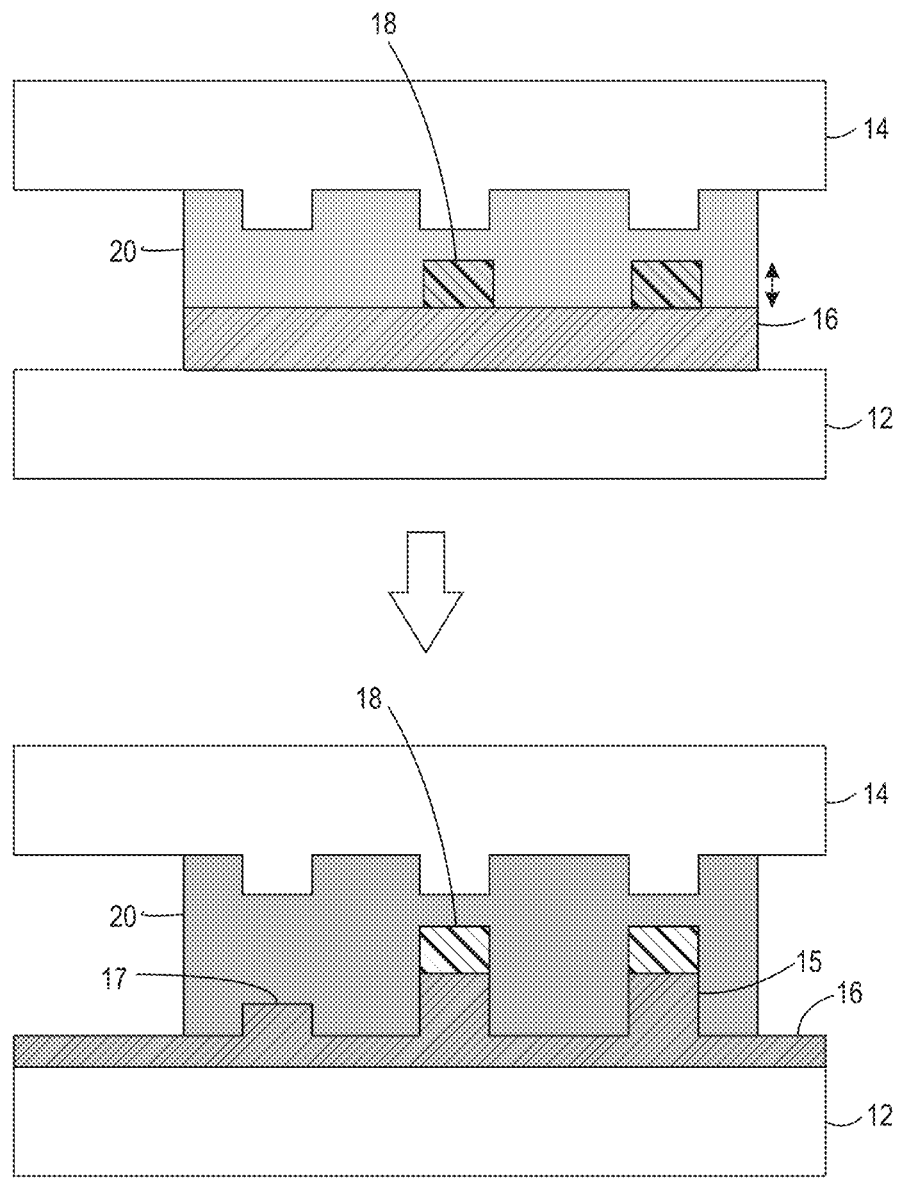

In FIG. 2, the electrode 14 has a different geometry than its geometry in FIG. 1 that allows shaping of the electric field. In this embodiment, the patterning material 18 has its own pattern. The bottom of FIG. 2 shows resulting shape of the material to be patterned 16. The material 16 has two taller columns such as 15, which result from the regions in which the patterning film 18 remained during application of the electric field. The dielectric constant or conductivity of 18 causes the material to try to close the gap between the electrodes, which pulls the regions of 16 upwards toward the electrode 14. The pillar 17 results from the same behavior of the material 16, but the material 16 does not have as strong a response.

Figure 3:
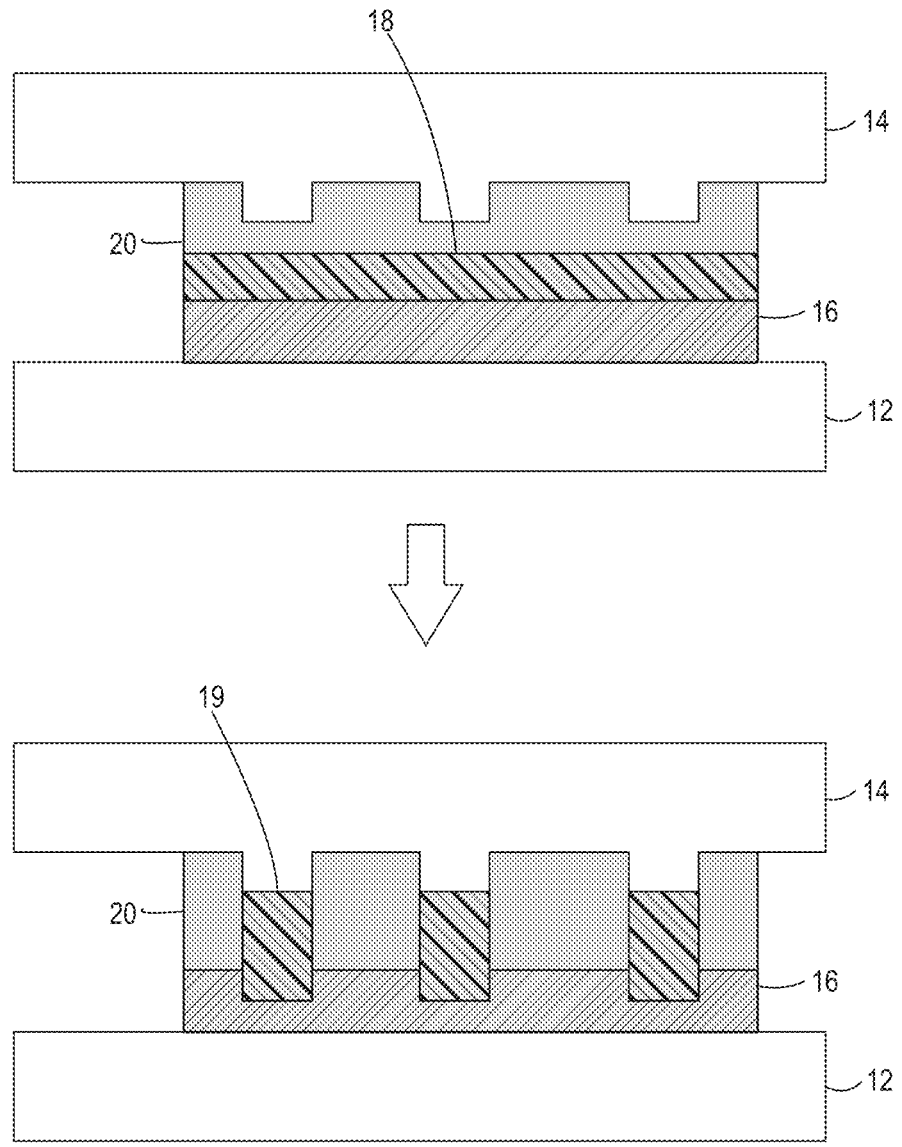

This type of effect is also achievable without using a pattern in the patterning material 18. As shown in FIG. 3, the patterning material 18 is deposited directly on top of the film to be patterned 16. The electrode 14 in this embodiment has its own pattern. When the field is applied, the material 18 reacts strongly and pulls itself into columns such as 19, pushing down into the material 16. The material 16 reacts as well and rises, as well as being displaced by the columns such as 18.

Figure 4:
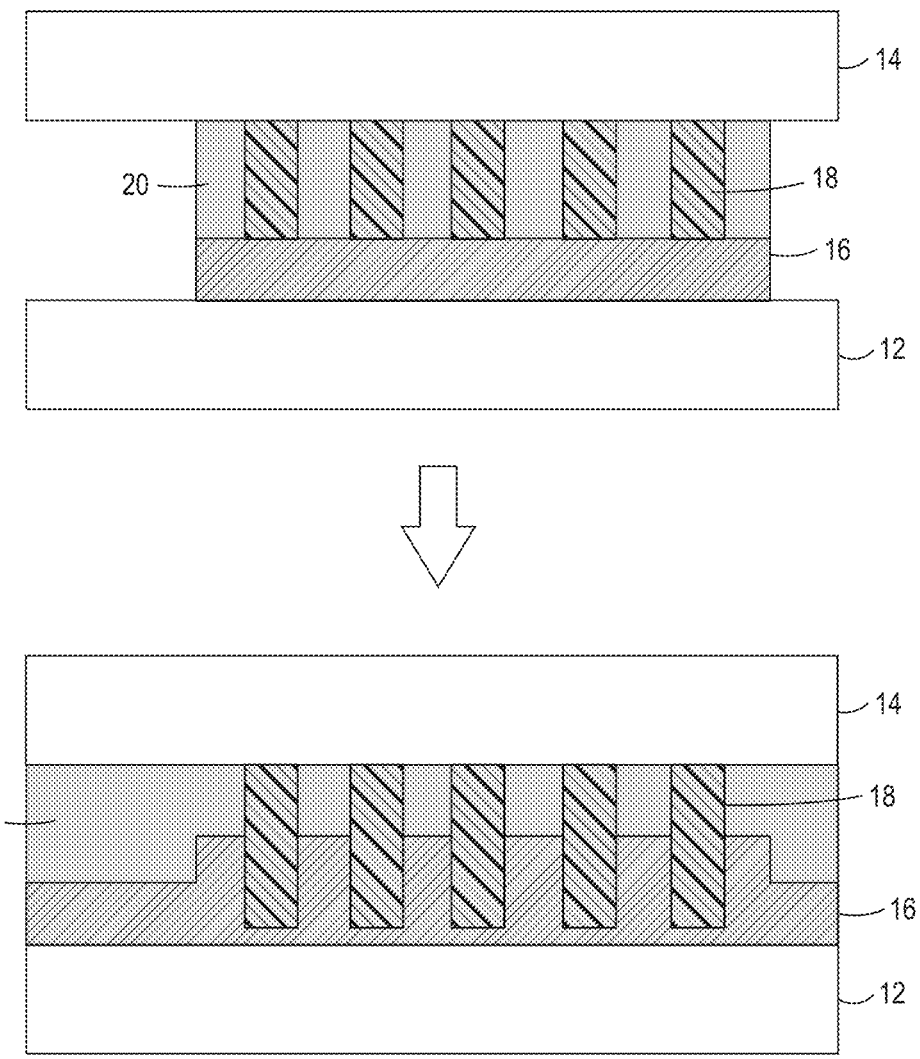

As mentioned above the patterning material could fill the entire gap D shown in FIG. 1. FIG. 4 shows an embodiment in which the patterning material 18 has a pattern of columns that extend from the top surface of the material to be patterned to the upper electrode. The bottom of FIG. 4 shows the resulting pattern after application of the electric field, which in this embodiment is not shaped. The materials try to bridge the gap between the electrodes such that the columns of material 18 try to, or do, reach the bottom electrode 12. In response to electric field and the resulting displacement caused by the movement of the material 18, the material to be patterned 16 rises towards the top electrode.

The addition of patterned electrodes and the capability to pattern or otherwise selectively deposit the second material, as well as the addition of multiple patterning materials and multiple materials to be patterned, allows for more control of the pattern formation, and provides multiple levels of design selection to achieve the desired pattern.

Figure 5:
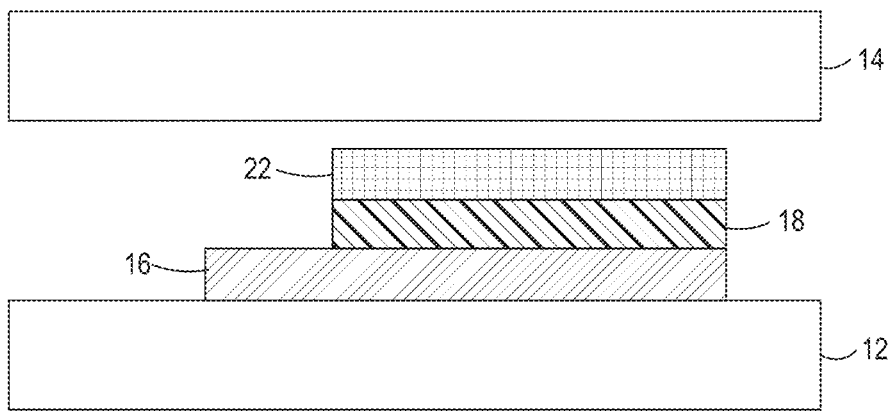
FIG. 5 shows an embodiment of a system to electrohydrodynamically pattern materials using at least two patterning materials.

FIG. 5 shows an embodiment of an EHD-FP system having an addition patterning material 22 that is different than the other patterning material and does not comprise air or a gas. The additional patterning material may reside partially or in its entirety on the other patterning material and may have a pattern or be continuous across the electric field. The additional patterning material may have a different dielectric constant or level of conductivity than either of the other patterning materials such as 18 and the material to be patterned 16 or it may have the same as one of the other materials. The air or gas 20 is not show here for simplicity but may be included.

Figure 6:
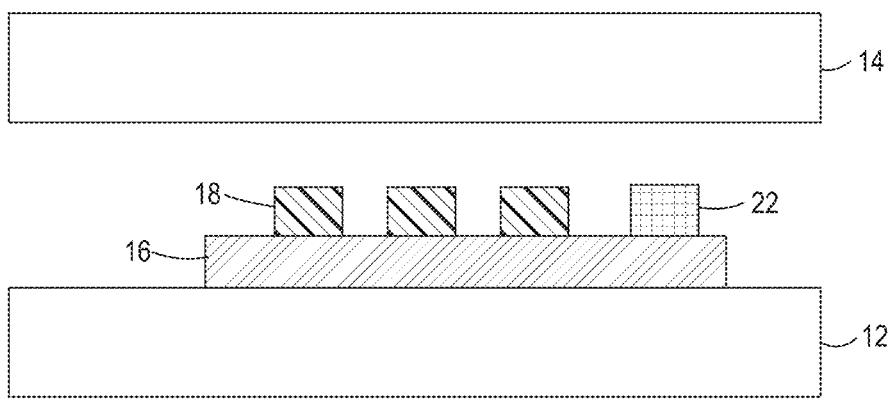
FIG. 6 shows an embodiment of a system to electrohydrodynamically pattern materials using at least two patterning materials.

FIG. 6 shows yet another level of control in which a pattern is to be formed in the material to be patterned 16, but consists of two patterning materials 18, and 22 on the material to be patterned. The two materials may be part of a same pattern across the surface of the first material, or may form two separated patterns on the surface of the first material or either of the electrode surfaces. The material to be patterned may react differently with the different materials 18 and 22, providing more complex control of the final pattern.

Figure 7:
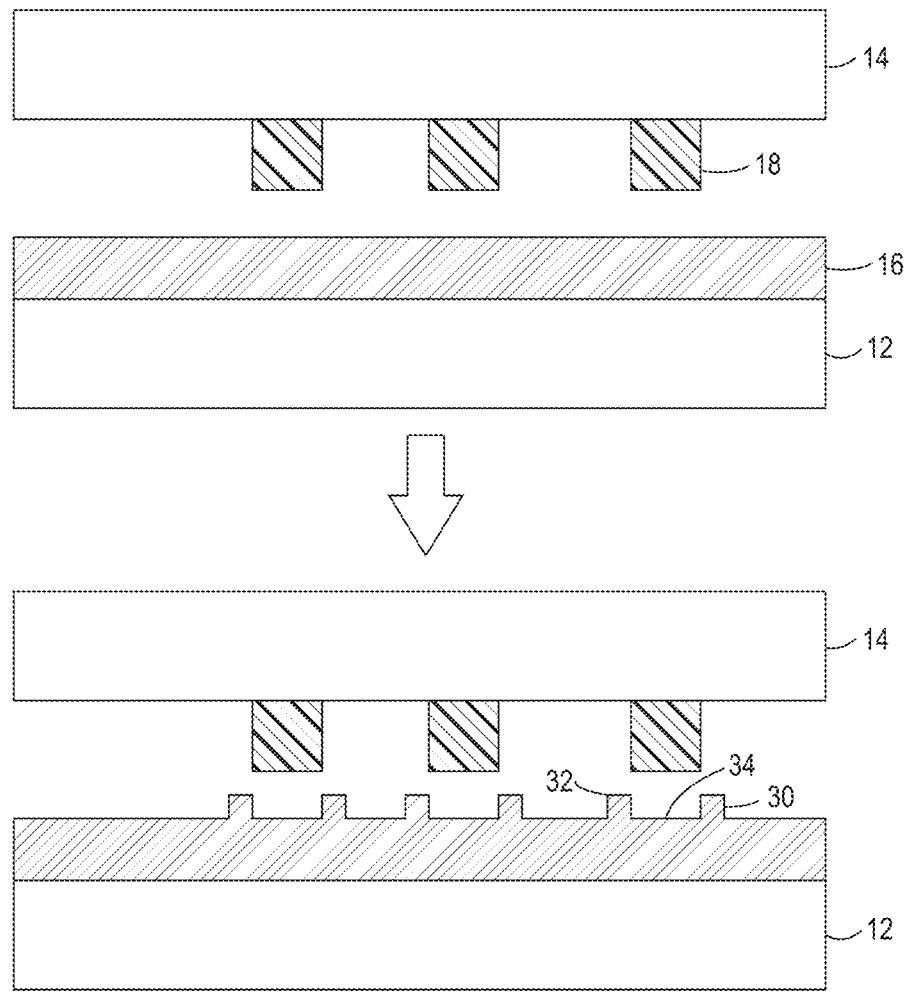
FIGS. 7-9 show alternative embodiments of a system to electrohydrodynamically pattern materials using at least one patterning material.

FIG. 7 shows an embodiment in which the patterning material 18 is in contact with at least one of the electrodes, in this example electrode 14. The pattern formed by the patterning material creates a negative of the field created with the shape affected by the patterning material. The pillars in the patterning material 18 create a pattern of features in the film to be patterned 16 comprising raised areas, pillars, such as 30 and 32, with a lower area 34 between them.

Figure 8:
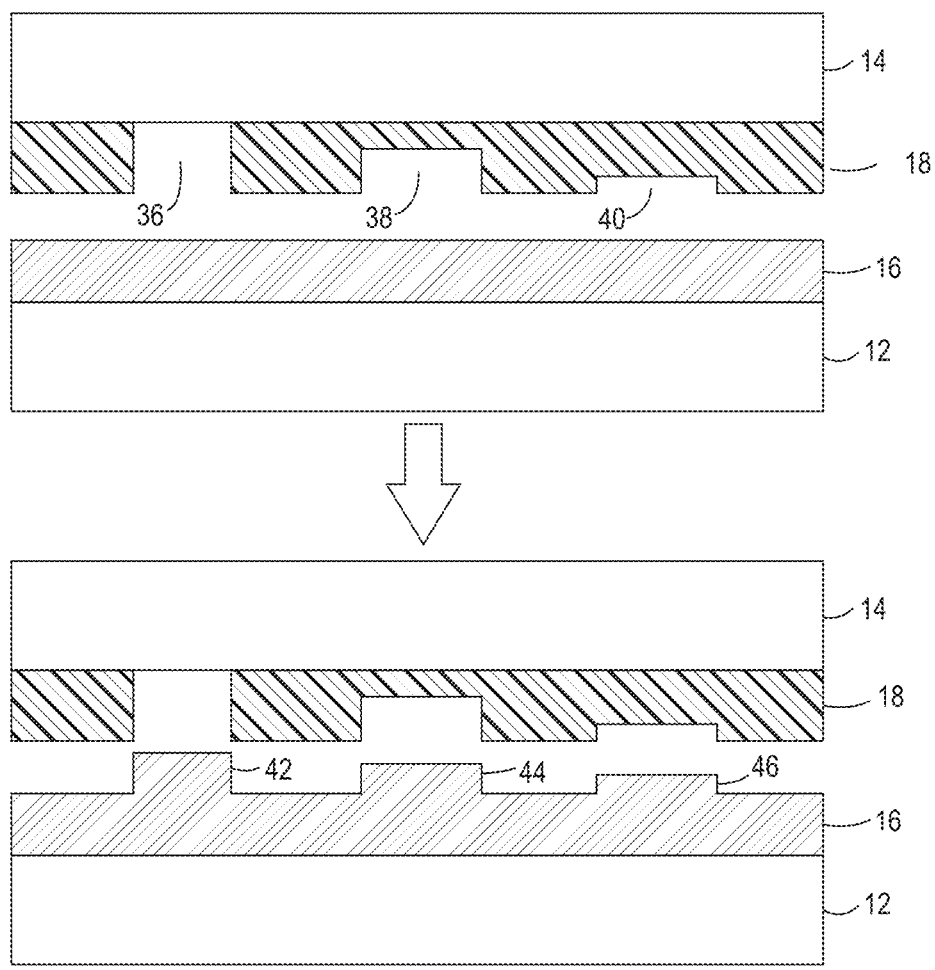

FIG. 8 shows another embodiment of a pattern formed in the patterning material 18 in which different recesses in the patterning material, such as 36, 38, and 40, have different depths. When the voltage is applied, these different depths of the recesses form different heights in the material to be patterned 16, such as 42, 44, and 46.

Figure 9:
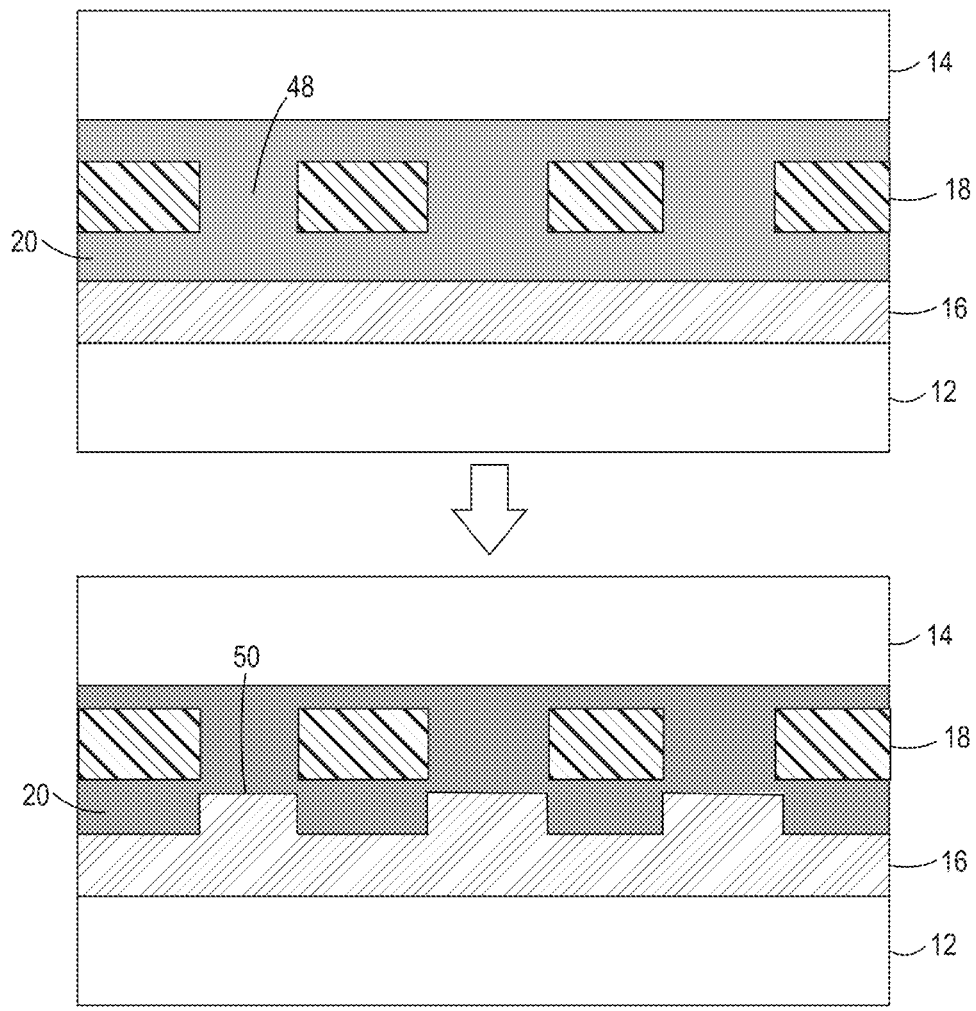

The patterning material 18 may take the form of a film having sections cut out and then suspended in the gas 20, such as air in the space, as shown in FIG. 9. The cutout sections such as 48 could all by the same size as shown, or they could have different sizes. The presence of the film with the cut out sections causes the field to create raised portions in the material to be patterned 16, such as 50.

Figure 10:
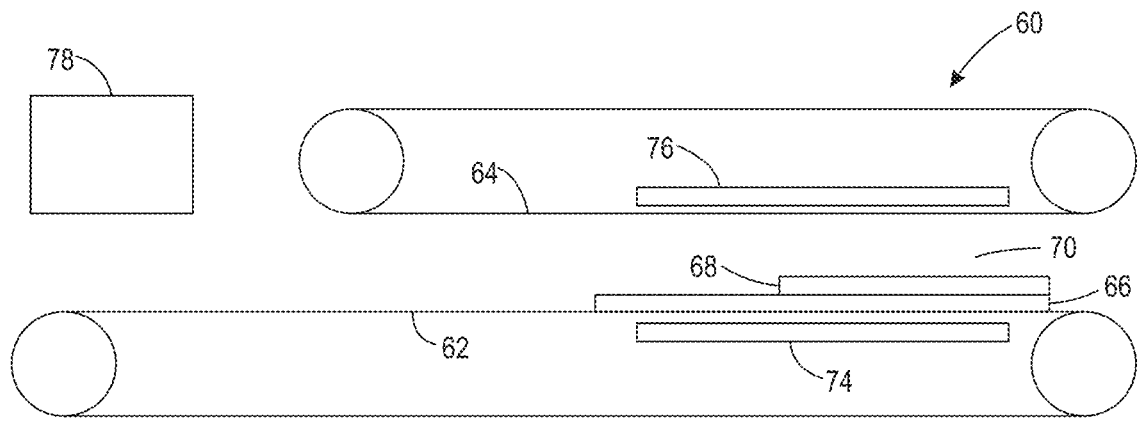
FIG. 10 shows an embodiment of a system to electrohydrodynamically pattern materials using a roll-to-roll process.

As discussed above, the film stack of the at least two materials will probably be formed before being transported into the active region. This may be accomplished using a roll-to-roll or other continuous manufacturing process. FIG. 10 shows an example of this type of a system, with no intention of limiting the process or system in any way to any of the elements of this discussion.

The system 60 of FIG. 10 has two belts 62 and 64. These belts could themselves act as electrodes, or they could lie adjacent electrodes such as 74 and 76 that form the active region. The material stack of at least one material to be patterned 66 and at least one patterning material 68 are in the active region between the two electrodes or belts. A gas, such as air, may reside in the gap 70. After the patterning, the material stack may be transported to a curing apparatus 78 that any of the materials in the stack to fix the pattern in place, such as by the application of heat or UV light. Alternatively, the material having the pattern could just be allowed to dry, or cool to solidification. Patterning materials may be removed before, after or during curing. The materials may be removed by physical processes, dissolved, evaporated, or any other process that is suitable.

While the systems of FIGS. 1-9 show different variations and alternatives, any one of these may be used with any other of the discussed embodiments and features. No limitation to any particular combination of the embodiments is intended, nor should any be implied.

Figure 11:
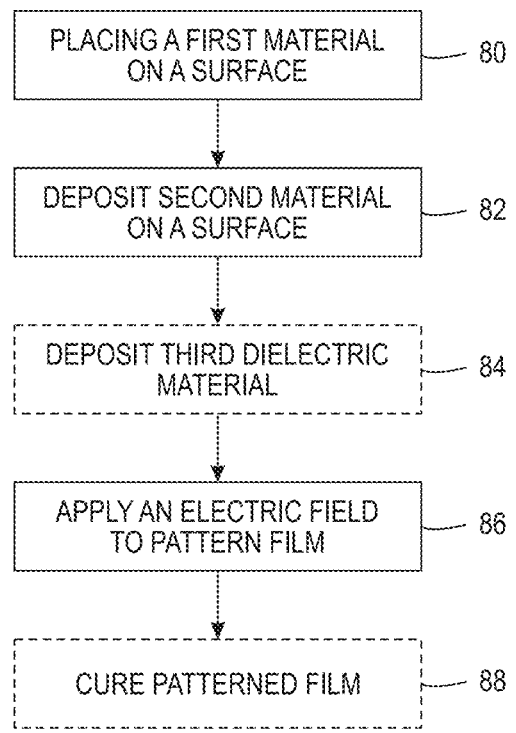
FIG. 11 shows a flowchart of one embodiment of a method to electrohydrodynamically pattern a material using at least one patterning material.

FIG. 11 shows a flowchart of an embodiment of a process to form patterned films using EHD-FP. At least one material to be patterned is placed on a surface at 80, which may be belt as shown in FIG. 4, another handling surface, or an electrode. The material(s) to be patterned may be selected from many different materials including those selected from the group consisting of: thermoplastic polymers; polystyrene; polyurethane; polypropylene; polyamide; polyethylene; polyvinyl; acrylates; acrylonitrile butadiene styrene; thermosetting polymers; thermal cure epoxies; 2-part epoxies; UV cure epoxies; polyesters; phenol-formaldehyde; silicone; and vinyl ester.

At least one patterning material, other than air, is then deposited on the first material at 82. The patterning material(s) may be deposited in a pattern using ink jet printing, or a stencil and doctor blade, as examples. Alternatively, the patterning material(s) could just be 'wiped' onto the material(s) to be patterned with a doctor blade or brush, or it may be selectively poured onto different regions of the material(s) to be patterned. These are all just examples. The patterning material(s) may comprise at least one of many materials, including those selected from the group consisting of: synthetic oil; natural oil; fluorinated oil; barium titanate particles; and PVDF.

If additional materials are used at 84, shown as a box with dashed lines to demonstrate that it is option, they would also be deposited, either on the material(s) to be patterned or at least partially on the other patterning material at 84.

At 86, the electric field is applied to the gap between the electrodes. The stack of materials may be transported into the active region to apply the electric field, or the electric field may be applied while the stack is stationary in the active region. With one of the goals being to create a commercially useful amount of patterned films, using a continuous process in which the films are deposited and then moved into and then out of the active region is more likely. This type of continuous process allows the process to produce films at one end of the process while new films are being formed at the other end of the process simultaneously.

If the material(s) to be patterned is curable after being patterned, the material(s) having the pattern would then be cured to fix the pattern in place. This part of the process may also involve removal of the patterning material(s). If additional patterning or patterned materials were used than these would also be cured and/or removed.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A continuous manufacturing system to electrohydrodynamically pattern at least one material to be patterned, comprising:
 a first belt comprising a first electrode having a first voltage;
 a second belt comprising a second electrode having a second voltage that is different from the first voltage;

the at least one material to be patterned residing between the first electrode and the second electrode;

a gap between at least one surface of the at least one material to be patterned and one of the first or second electrodes;

at least one removable patterning material deposited on the surface of the at least one material to be patterned such that the at least one removable patterning material only partially fills the gap, wherein the at least one removable patterning material is a material other than air and has one of a different dielectric constant than the at least one material to be patterned, different conductivity than the at least one material to be patterned, or modifies the electric field strength in the gap that causes the at least one removable patterning material to react differently to application of an electric field to form a desired pattern in the at least one material to be patterned;

a curing apparatus to cure the at least one material to be patterned in the desired pattern; and at least one filling material filling the gap.

2. The system as claimed in claim 1, wherein at least one of the first and second electrodes is patterned such that the gap between the first and second electrodes is non uniform in space.

3. The system as claimed in claim 1, wherein at least one of the first and second electrodes has a spatially non-uniform voltage such that the electric field between the first and second electrodes is non-uniform in space.

4. The system as claimed in claim 1, wherein the at least one of the materials to be patterned resides at least partially in contact with, one of the first and second belts.

5. The system as claimed in claim 1, wherein the at least one removable patterning material is electrically conductive.

6. The system as claimed in claim 1, wherein the at least one material to be patterned is electrically conductive.

7. The system as claimed in claim 1, the at least one removable patterning material is physically patterned based upon the desired pattern to be formed in the at least one material to be patterned.

8. The system in claim 1 where at least a portion of the electrodes have patterned features.

9. The system as claimed in claim 1, wherein the at least one filling material comprises a gas.

10. A continuous manufacturing system to electrohydrodynamically pattern at least one dielectric material to be patterned, comprising:

a first belt comprising a first electrode having a first voltage;

a second belt comprising a second electrode having a second voltage;

a first material comprising the at least one dielectric material to be patterned residing between the first electrode and the second electrode, the first material being responsive to an electric field formed between the first electrode and the second electrode, the at least one dielectric material to be patterned residing directly on, and in contact with the first belt;

a gap between a surface of the first material and second belt;

a second material comprising at least one removable patterning material selectively located on a surface of the at least one dielectric material to be patterned, such that the at least one removable patterning material fills only a portion of the gap according to a desired pattern of the at least one dielectric material to be patterned and has characteristics different from the at least one dielectric material to be patterned that cause the at least one removable patterning material to react differently to application of an electric field to form the desired pattern;

a curing apparatus to cure the at least one dielectric material to be patterned in the desired pattern; and a third material comprising a filling material in the gap, the third material comprising a material that is not a gas.

11. The system as claimed in claim 10, wherein at least one of the first and second electrodes is patterned such that a voltage profile or gap between the electrodes on the at least one of the first and second electrodes is non uniform in space.

12. The system as claimed in claim 11, wherein the at least one dielectric material to be patterned is based upon the desired pattern to be formed in the at least one dielectric material to be patterned.

* * * * *